United States Patent [19]

Iwasaki

[11] Patent Number: 4,965,220

[45] Date of Patent: * Oct. 23, 1990

[54] METHOD OF MANUFACTURING A SEMICONDUCTOR INTEGRATED CIRCUIT DEVICE COMPRISING AN MOS TRANSISTOR AND A BIPOLAR TRANSISTOR

[75] Inventor: Hiroshi Iwasaki, Chigasaki, Japan

[73] Assignee: Kabushiki Kaisha Toshiba, Kawasaki, Japan

[ * ] Notice: The portion of the term of this patent subsequent to Apr. 4, 2006 has been disclaimed.

[21] Appl. No.: 306,393

[22] Filed: Feb. 6, 1989

Related U.S. Application Data

[60] Continuation of Ser. No. 96,241, Sep. 8, 1987, Pat. No. 4,818,720, which is a continuation of Ser. No. 846,512, Mar. 31, 1986, abandoned, which is a division of Ser. No. 658,029, Oct. 5, 1984, abandoned.

[30] Foreign Application Priority Data

Oct. 7, 1983 [JP] Japan .................................. 58-187930

[51] Int. Cl.$^5$ ..................... H01L 21/70; H01L 21/265
[52] U.S. Cl. .............................. 437/59; 148/DIG. 32; 148/DIG. 10; 148/DIG. 38; 148/DIG. 123; 437/31; 437/76; 437/162; 437/954; 357/43
[58] Field of Search ................... 437/31, 41, 51, 56, 437/57, 59, 76, 160, 58, 162, 165, 168, 186, 954; 357/42, 43, 48, 44, 59; 148/DIG. 10, 30, 32, 37, 38, 76, 82, 83, 123, 124

[56] References Cited

U.S. PATENT DOCUMENTS

| | | | |
|---|---|---|---|
| 3,974,516 | 8/1976 | Steinmaier | 357/42 |
| 4,032,372 | 6/1977 | Vora | 357/42 |
| 4,120,707 | 10/1978 | Beasom | 357/43 |
| 4,325,180 | 4/1982 | Curran | 437/48 |
| 4,486,942 | 12/1984 | Hirao | 437/59 |
| 4,497,106 | 2/1985 | Momma et al. | 437/59 |
| 4,525,922 | 7/1985 | Kiriseko | 437/176 |
| 4,590,666 | 5/1986 | Goto | 437/33 |

FOREIGN PATENT DOCUMENTS

| | | | |
|---|---|---|---|
| 0052450 | 5/1982 | European Pat. Off. | |
| 0067661 | 12/1982 | European Pat. Off. | |
| 0097379 | 6/1983 | European Pat. Off. | |
| 2319978 | 2/1977 | France | |
| 0066352 | 4/1983 | Japan | 437/81 |

OTHER PUBLICATIONS

Ghaudhi, *VLSI Fabrication Principles*, John Wiley & Sons, New York, NY, 1983, pp. 170–171.
Anantha et al., "Method for Making Self-Aligned MESFETs with Process Compatible with NPN Transistors", IBM TDB, vol. 23, No. 1, Jun. 1980, pp. 167–169.
Castrucci et al., "Bipolar/FET High-Performance Circuit", IBM TDB, vol. 16, No. 8, Jan. 1974, pp. 2719–2720.

Primary Examiner—Olik Chaudhuri
Assistant Examiner—William Bunch
Attorney, Agent, or Firm—Finnegan, Henderson, Farabow, Garrett, and Dunner

[57] ABSTRACT

A semiconductor integrated circuit device is disclosed which comprises a bipolar transistor and a field effect transistor, in which a gate electrode of the field effect transistor and a collector electrode of the bipolar transistor are formed from a common electrode layer of a high impurity concentration, and in which the collector region of the bipolar transistor comprises a region of a high impurity concentration having a conductivity type the same as that of the collector region of the bipolar transistor.

4 Claims, 4 Drawing Sheets

F I G. 2C
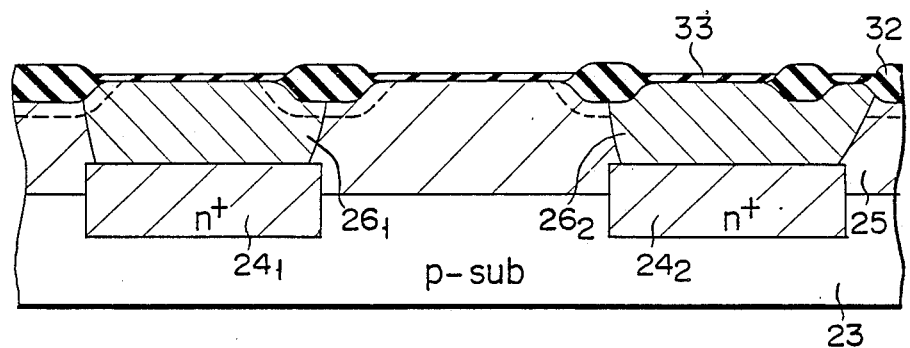
F I G. 2D
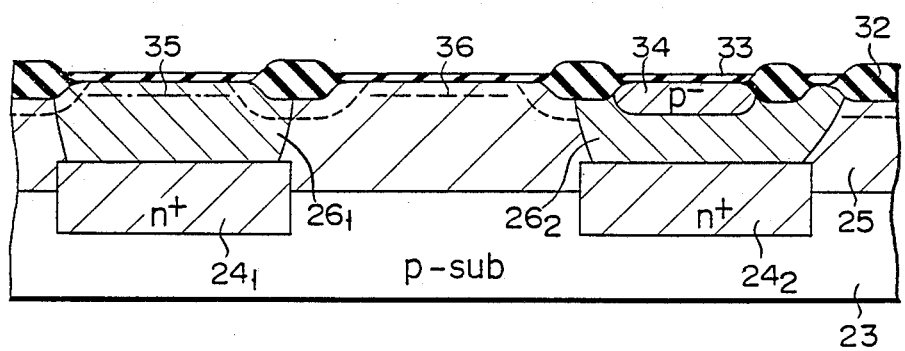
F I G. 2E
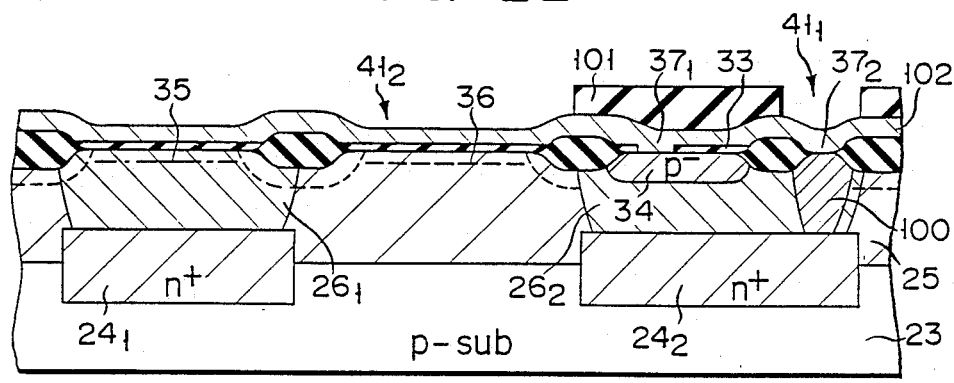

METHOD OF MANUFACTURING A SEMICONDUCTOR INTEGRATED CIRCUIT DEVICE COMPRISING AN MOS TRANSISTOR AND A BIPOLAR TRANSISTOR

This is a continuation of application Ser. No. 096,241, filed Sept. 8, 1987, U.S. Pat. No. 4,818,720 which is a continuation of Ser. No. 846,512, filed Mar. 31, 1986, abandoned, which is a division of Ser. No. 658,029, filed Oct. 5, 1984, abandoned.

BACKGROUND OF THE INVENTION

This invention relates to a semiconductor integrated circuit device comprising an MOS transistor and a bipolar transistor and a manufacturing method of the same.

There has been known a semiconductor integrated circuit device comprising an MOS (metal oxide semiconductor) or field effect transistor and a bipolar transistor. An MOS transistor operates at a high speed. A bipolar transistor has a high cut-off frequency and consumes less power. For forming a bipolar transistor, there has been generally prepared a two-layered silicon wafer comprising a semiconductor substrate of a conductivity type and an epitaxial semiconductor layer formed thereon of an opposite conductivity type, or a two-layered silicon wafer further comprising an embedded layer which is formed between the substrate and epitaxial layer and which has the same as that of the epitaxial layer as well as a high impurity concentration. For forming complementary MOS transistors, a single-layer silicon wafer has been prepared. When an N conductivity type single-layer silicon wafer having the impurity concentration of $1 \times 10^{15}$ cm$^{-3}$, for example, is prepared for forming complementary MOS transistors, a P well region whose surface impurity concentration is $1 \times 10^{16}$ cm$^{-3}$, for example, is formed in the silicon wafer. An N channel MOS transistor is formed in the P well region. A P channel MOS transistor is formed in the substrate.

On forming a bipolar transistor, the highest temperature possible is applied to the wafer at the heating step in which an impurity is diffused into the wafer to form an isolation region for electrically isolating the respective semiconductor circuit devices from each other. A high temperature of 1200° C. is applied to the wafer for one or for one and one-half time period to form an isolation region of the thickness of 5 μm. In this case, the surface resistance of the isolation region is about 5 to 50 Ω/□. In forming an MOS transistor, the highest temperature possible is applied to the wafer at the heating step in which a well region is formed. A temperature of 1190° C. is applied to the wafer for 12 hours to form a well region of a thickness of 5 to 6 μm.

The highest temperature applying step is commonly applied in order to form bipolar and MOS transistors so that the time for manufacturing the device is shortened. In this case, there is prepared a semiconductor wafer comprising a P substrate 11, an N+ embedded region 12 of a high impurity concentration formed on a P substrate 11 by an impurity diffusion process, and an N epitaxial layer 13 formed on the whole substrate surface (FIG. 1). Isolation P regions 14 for electrically isolating the respective integrated circuit device and P well regions 15 are first formed in the epitaxial layer 13. The heating step for the P well region 15 is set longer than that for the isolation regions 14. Therefore, only P well region 15 is first thermally heated for a predetermined period of time. Thereafter, the P well regions 15 and isolation regions 14 are commonly thermally heated. For example, a thermal oxidation film of about 1000 Å is formed on the wafer. Then a boron ion with a low dose amount of about $10^{12}$ cm$^{-2}$ is implanted into the P well region 15. Thereafter, the wafer is subjected to a heating process to diffuse the implanted ion in the P well 15. Next, a boron ion with a dose amount of about $10^{13}$ to $10^{14}$ cm$^{-2}$ is implanted into the isolation regions 14 and then the P well 15 and the isolation region 14 are concurrently subjected to a heating process for impurity diffusion. The temperature at the concurrent heating step is about 1190° C. Thus, regions where MOS transistor and bipolar transistors will be formed are formed in the wafer.

Bipolar transistors and CMOS transistors are then formed. Specifically, gate oxidation films $16_1$, $16_2$ of a P channel MOS transistor and an N channel MOS transistor are first formed, and then gate electrodes $17_1$, $17_2$ of polysilicon are formed on the film $16_1$, $16_2$, respectively. Next, a P type impurity is diffused into the wafer to form the source and drain regions 18 and 18′ of the P channel MOS transistor Tr1, and to form the base regions 19 of the bipolar transistor Tr3. An N type of impurity is thereafter diffused into the wafer to form the source and drain regions 20 and 20′ of the N channel MOS transistor Tr2, and to form the emitter and collector regions 21, 22 of the bipolar transistor Tr3.

However, with the conventional manufacturing method, in the heating step for impurity diffusion in the P well 15 and in the isolation regions 14, the impurity in the embedded layers 12 is largely diffused into the N epitaxial layer 13. It is difficult to keep the impurity concentration of that region of the epitaxial layer 13 which is on the embedded regions 12 in the drawings homogeneous. However, it is required that the bipolar transistor have an impurity concentration in the epitaxial layer 13 that is homogeneous. The reason for this is that the static characteristic and withstand voltage of the bipolar transistor are directly affected by the impurity concentration. Also, the threshold voltage of the MOS transistor varies when the impurity concentration is not homogeneous. With the conventional manufacturing method, the base and emitter regions of the bipolar transistor, and the source and drain regions of the MOS transistor are formed with the same or common steps. However, with this technique, it is difficult to provide satisfactory characteristics to both MOS and bipolar transistors.

In the conventional circuit device as shown in FIG. 1, an N+ impurity diffused region of a high impurity concentration and of a small thickness is generally formed in the collector region of bipolar transistor when it is required to reduce the collector resistance of the bipolar transistor and also to reduce the ON resistance. However, this complicates the manufacturing process of the device.

SUMMARY OF THE INVENTION

This invention has been achieved under the circumstances described above and has as its object to provide an integrated semiconductor circuit device comprising an MOS transistor operable at high speed and a bipolar transistor having a high cut-off frequency, a low ON resistance and a low power consumption. Another object of the invention is to provide a method for manufacturing the semiconductor integrated circuit device.

According to the invention, there is provided a method of manufacturing a semiconductor integrated circuit device comprising:

- a step of forming a first semiconductor region on a semiconductor substrate of a first conductivity type, the first semiconductor region being of a second conductivity type and having a high impurity concentration;
- a step of forming a second semiconductor region of said first conductivity type on said semiconductor substrate;
- a step of forming a third semiconductor region of said second conductivity type in said second semiconductor region, the third semiconductor region being electrically connected to said first semiconductor region;
- a step of forming a field effect transistor in said second or third semiconductor region, the step of forming the field effect transistor comprising a step forming gate electrodes of the field effect transistor and the emitter and collector electrodes of the bipolar transistor;
- a step of forming a bipolar transistor in said third semiconductor region; and
- a step of forming a fourth semiconductor region of said second conductivity type in said third semiconductor region, using said collector electrode of the bipolar transistor as an impurity concentration region, the fourth semiconductor region having a high impurity concentration and a large thickness.

According to the invention, there is further provided a semiconductor integrated circuit device comprising a bipolar transistor and a field effect transistor in which a gate electrode of the field effect transistor and a collector electrode of the bipolar transistor are formed from a common electrode layer of a high impurity concentration, and in which the collector leading region of the bipolar transistor comprises a region of a high impurity concentration having a conductivity type equal to that of the collector region of the bipolar transistor.

BRIEF DESCRIPTION OF THE DRAWINGS

FIGS. 2A to 2H show cross-sectional views of the semiconductor integrated circuit device at the respective manufacturing steps according to an embodiment of the invention.

DETAILED DESCRIPTION OF THE PREFERRED EMBODIMENTS

There will now be described a method of manufacturing a semiconductor integrated circuit device according to an embodiment of the invention by referring to FIGS. 2A to 2H.

Figure 1:
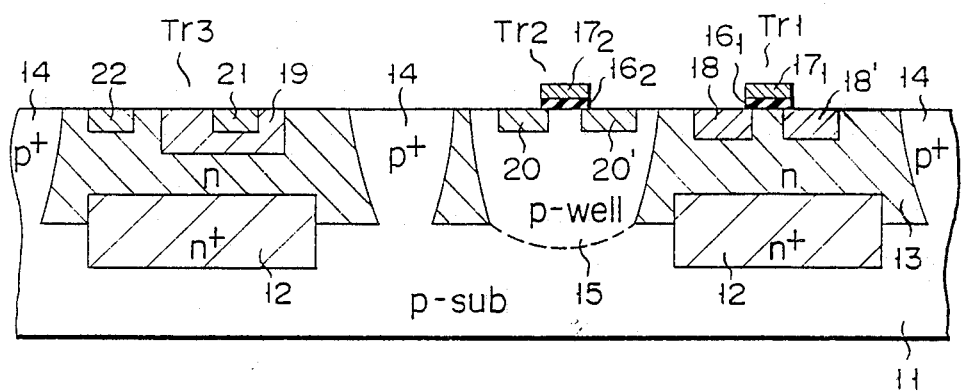
FIG. 1 shows a cross-sectional view of a conventional semiconductor integrated circuit device.
Figure 2A:
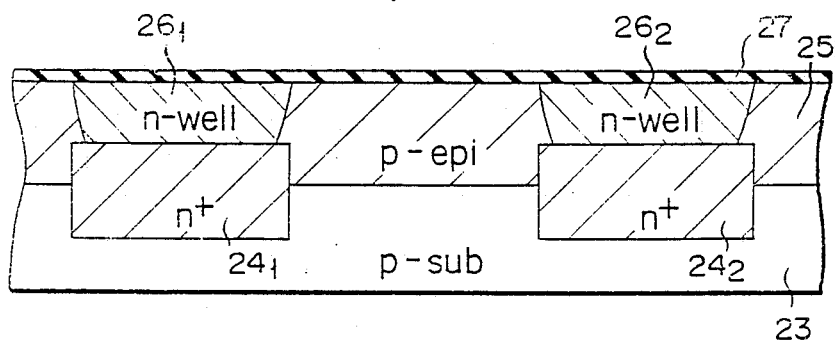

Process 1 (FIG. 2A)

A P conductivity type silicon substrate 23 of an impurity concentration of about $10^{14}$ to about $10^{17}$ cm$^{-3}$ has been prepared. Antimony Sb or Arsenic As, for example, are diffused into the silicon substrate 23 through a patterned masking insulation film, e.g., a thermal oxidation film (not shown) formed on the substrate 23, thereby forming N+ impurity diffusion regions $24_1$, $24_2$ of a high impurity concentration of about $10^{18}$ to about $10^{20}$ cm$^{-2}$ in the substrate 23. The insulation film is then removed. Thereafter, a P conductivity type epitaxial region or layer 25 is formed on the substrate 23. The thickness of the P epitaxial layer 25 is from about 1 to about 5 μm. The specific resistivity of the epitaxial layer 25 is about 0.5 to about 10 Ω·cm. However, these values are merely typical and may be varied according to the requirements for the elements to be formed.

Then, N well regions $26_1$, $26_2$ are formed in which a P channel MOS (metal oxide semiconductor) or field effect transistor and a bipolar transistor are formed as described later. Specifically, a thermal oxidation film 27 of about 1000 Å is first formed on the major surface of the wafer and then a phosphor ion is implanted into the oxidation film 27 with a dose amount of, for example, about $2\times10^{12}$ cm$^{-2}$ under an accelerating voltage of, for example, about 150 KeV. Thereafter, a high temperature heating of more than 1000° C. is carried out to the wafer to diffuse the implanted ion into the wafer to a depth of about 3 μm, thus forming the N well regions $26_1$, $26_2$ having a surface impurity concentration of about 8 to $10\times10^{15}$ cm$^{-3}$. At this time, the embedded regions $24_1$, $24_2$ extend into the epitaxial layer 25. Therefore, the diffusion length of the N well regions $24_1$, $24_2$ is shortened, which in turn, shortens the diffusion time for the N well regions $24_1$, $24_2$. Thereafter, the oxidation film 27 is removed.

Figure 2B:
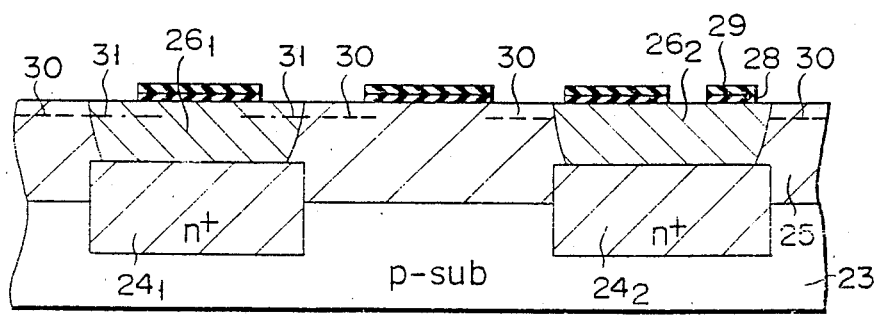

Process 2 (FIG. 2B)

A thermal oxidation film 28 of about 300 to 2000 Å in thickness is formed on the wafer, and after that an antioxidized insulation film 29 of SiN, for example, of about 1000 Å in thickness is formed on the thermal oxidation film 28. The films 28 and 29 are patterned to have a field insulation pattern as shown in FIG. 2B. Thereafter, channel cutting regions 30, 31 are formed in the epitaxial layer 25 through ion implantation of boron, phosphor, etc., if necessary.

Process 3 (FIG. 2C)

A field oxidation film 32 of about 0.7 to 1.2 μm in thickness having a predetermined pattern is formed by a local oxidation technique using the insulation layer 29 as a mask. Then, the insulation film 29 and thermal oxidation film 28 are removed. A thermal oxidation film 33 of about 200 to 1000 Å in thickness is formed on the wafer as a gate oxidation film of the MOS transistor.

Process 4 (FIG. 2D)

A boron ion is implanted into the wafer using as a mask a photoresist film (not shown) and the field oxidation film 32 to form an active base region (an internal base region of a draft base structure) 34 of a bipolar transistor. After that the wafer is annealed at a temperature of about 1000° to 1100° C. so that the base region 34 has a sheet resistance ρs of about 500 to 1000 Ω/□. If necessary, ion implantation is carried out to channel regions 35, 36 to define the gate threshold voltages of the P and N channel, i.e., complementary channel, MOS transistors, respectively.

Process 5 (FIG. 2E)

Patterning is carried out on the thermal oxidation film 33 so that it has holes $37_1$ and $37_2$ to diffuse an impurity to the emitter region and collector region of the bipolar transistor. Thereafter, a polysilicon film 102 not doped with an impurity and of about 2000 to 4000 Å is formed on the structure. A CVD (chemical vapor deposition)

film 101 of $SiO_2$, for example, of about 5000 Å in thickness is formed on the polysilicon film 102. Those regions of the CVD layer 101 corresponding to the collector region $41_1$ of the bipolar transistor and the region $41_2$ where the MOS transistors are formed are removed. A phosphor is diffused from a diffusion source of $POCl_3$, for example, at a high concentration into the polysilicon film 102, thereby reducing the sheet resistance $\rho s$ of the polysilicon film 102 to about 20 $\Omega/\square$. The diffusion coefficient of phosphor to polysilicon is large. Therefore, at the region $41_1$, the phosphor ion diffused into the polysilicon film 102 passes through the polysilicon film 102 and is diffused into the N well region $26_2$ to form N+ region 100 of a high impurity concentration and of a large thickness in the N well region $26_2$. The N+ region 100 is a collector leading region and reaches the N+ embedded region $24_2$. In other words, the N+ region 100 extends in the direction of thickness of the N+ embedded region $24_2$ to the PN junction defined between the N well region $26_2$ and N+ embedded region $24_2$. The impurity concentration of the $POCl_3$ and the heating temperature of the thermal diffusion step are determined so that the N+ region 100 reaches the N+ embedded region $24_2$. Then, the CVD film 101 is fully removed. Next, arsenic ion is implanted into only that region of the polysilicon film 102 corresponding to the bipolar transistor region or to the entire region of the polysilicon film 102 with a dose amount of, e.g., about 5 to $15 \times 10^{15}$ cm$^{-2}$ and an accelerating voltage of e.g., 150 KeV. Thereafter, annealing is carried out to homogenize the impurity concentration of arsenic in the polysilicon film 102.

Figure 3:
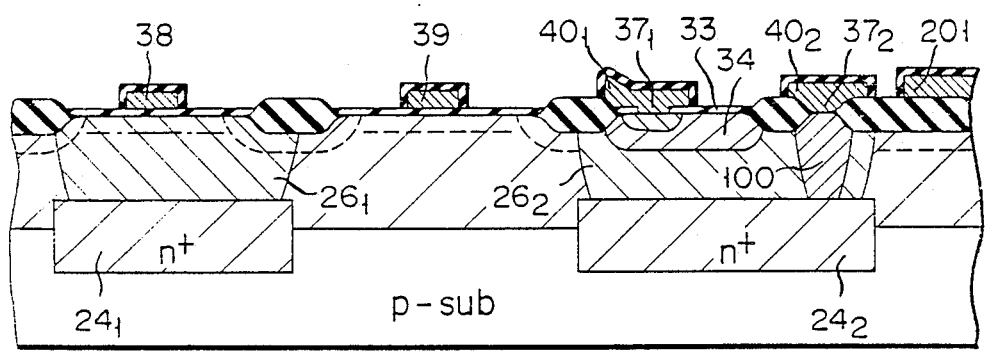
FIG. 3 shows a cross-sectional view of a semiconductor integrated circuit device according to another embodiment of the invention.

Alternatively, a polysilicon film doped with arsenic may be formed instead of the updoped polysilicon film 102, and a phosphor may be diffused with a high impurity concentration into those regions of the arsenic doped polysilicon film corresponding to the collector region $41_1$ of the bipolar transistor and the region $41_2$ where the MOS transistors are formed to reduce the sheet resistance of the regions of the arsenic doped polysilicon film (FIG. 3).

Figure 2F:
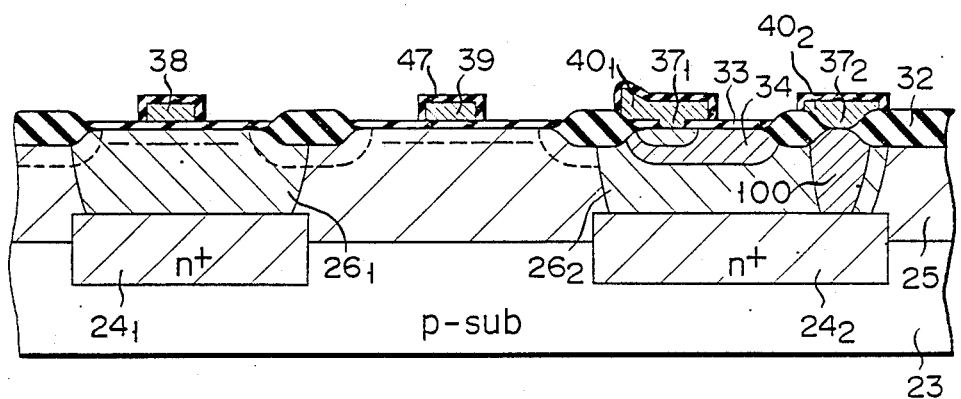

Process 6 (FIG. 2F)

The polysilicon film 102 is patterned to form the gate electrodes 38 and 39 of the MOS transistors, and the emitter and collector electrodes $40_1$ and $40_2$ of the bipolar transistor. Then, an arsenic ion is implanted into the polysilicon electrodes 38, 39, $40_1$ and $40_2$ and annealing is carried out so that the implanted arsenic ion is diffused into the wafer to form an emitter region of the bipolar transistor. The current amplification factor of the bipolar transistor is high with a shallow PN junction because the arsenic from the polysilicon film 102 is diffused. After that, a thermal oxidation film 47 is formed on the surface of the polysilicon electrodes 38, 39, $40_1$ and $40_2$.

When it is required that a polysilicon resistor be formed in the semiconductor device, a boron ion is implanted into the undoped polysilicon film 102, and annealing is carried out. Next, phosphor is diffused into the gate region of the MOS transistor and into the collector region of the bipolar transistor. Arsenic is diffused into the emitter region of the bipolar transistor. With this method, a polysilicon resistor 201 is formed by a relatively simple process. The polysilicon resistor 201 has a small variation of resistance and a preferable temperature characteristic. The polysilicon resistor 201 can also have a high resistance when the dose amount of the ion implantation of boron is controlled.

Figure 2G:
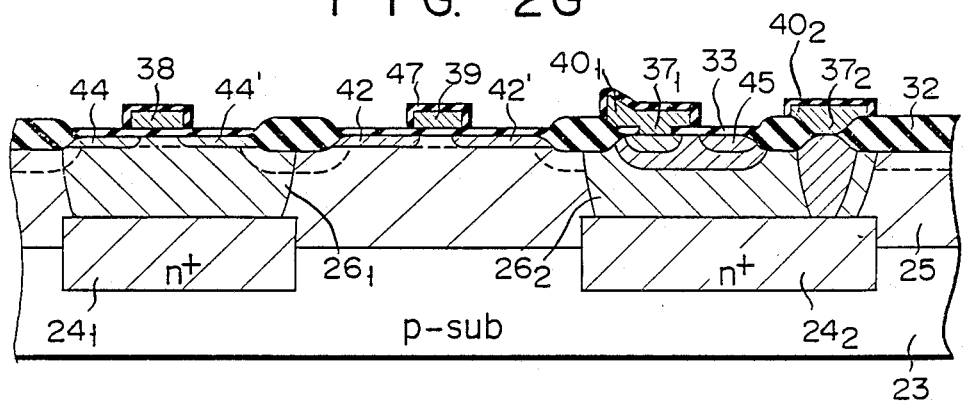

Process 7 (FIG. 2G)

The source and drain regions 42, 42' of the N channel MOS transistor are formed through an implantation of an arsenic ion using a self-aligning field oxidation film or polysilicon regions. Similarly, the source and drain regions 44, 44' of the P channel MOS transistor and an outer base region of the bipolar transistor are formed through an implantation of a boron ion using a self-aligning field oxidation film or polysilicon regions.

Figure 2H:
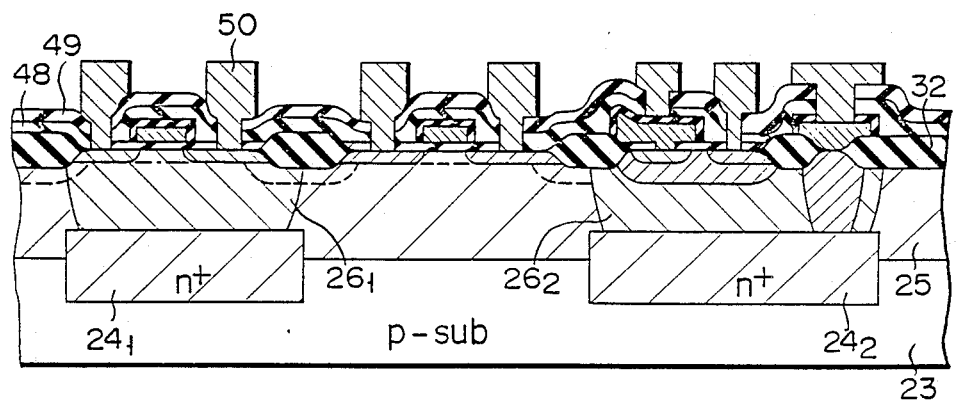

Process 8 (FIG. 2H)

Two superposed passivation films 48, 49 of a predetermined pattern are formed on the structure. A metal is deposited on the structure to form a metal film. The metal film is patterned to form metal regions 50 leading to the respective items. Through the processes described above, the semiconductor integrated circuit device is manufactured.

With the manufacturing method of the semiconductor integrated device, the emitter region of the bipolar transistor is formed by a diffused arsenic from the polysilicon film. Therefore, the device has a high current amplification factor with a shallow PN junction between the emitter region and base region.

The device also includes the collector leading region 100 of a high impurity concentration. The region 100 reduces the collector resistance of the bipolar transistor, which, in turn, reduces the ON resistance thereof. Therefore, the saturation voltage of the bipolar transistor is small.

As will be clear from the above, with the manufacturing method of the invention, the polysilicon film of a high impurity concentration formed at a common or same step is used as a source which diffuses an impurity to form the collector leading region. The polysilicon film is also used to form both the gate electrode of the MOS transistor and the emitter and collector electrodes of the bipolar transistor. Therefore, the manufacturing method is simple and also provides a semiconductor integrated circuit device comprising an MOS transistor operable at a high speed and a bipolar transistor having a high cut-off frequency (3 to 4 GHz), a low ON resistance and a low power dissipation.

This invention is not limited to the embodiments described above. For example, when a leading region similar to the leading region 100 is provided in N well region $26_2$, the resistance of the N well region $26_2$ is reduced, which, in turn, suppresses the latch-up phenomenon common to parasitic bipolar transistors.

In the manufacturing method described above, the emitter region of the bipolar transistor is formed by the diffusion of an arsenic ion doped in the polysilicon film 102. However, the emitter region may be formed by the implantation of an arsenic ion at a common step in which the source and drain regions of the N channel MOS transistor are formed.

The embodiments described above refer to a device in which the bipolar transistor is of the NPN vertical type. However, this invention can also be applied to a device in which the bipolar transistor is of a PNP lateral type. This invention can also applied to a device comprising a bipolar integrated circuit, e.g., an analog circuit including a bipolar transistor. Also this invention is applicable to a device comprising a high speed bipolar logic, e.g., an emitter coupled logic (ECL), including a vertical NPN transistor.

What is claimed is:

1. A method of manufacturing a semiconductor integrated circuit device which comprises a bipolar transistor and a field effect transistor, the method comprising the steps of:
   forming, in a semiconductor substrate of a first conductivity type, first semiconductor regions of a second conductivity type;
   forming a semiconductor layer of said first conductivity type on said semiconductor substrate;
   forming, on said semiconductor layer, second semiconductor regions of said second conductivity type contacting said first semiconductor regions;
   forming, on said semiconductor layer, an insulation film having a contact hole formed therein leading to a portion of a predetermined one of said second semiconductor regions;
   forming an impurity diffusion source layer of said second conductivity type on both said insulation film and said portion of said last-mentioned second semiconductor region via said contact hole;
   doping said last-mentioned second semiconductor region with an impurity from said impurity diffusion source layer via said contact hole formed in said insulation film, to form, in said last-mentioned second semiconductor region, a third semiconductor region of said second conductivity type constituting a collector leading region, having a high impurity concentration and contacting the first semiconductor region contacting said last-mentioned second semiconductor region; and
   patterning said impurity diffusion source layer to form a gate electrode of a field effect transistor and a collector electrode of a bipolar transistor with said bipolar transistor being formed in said last-mentioned second semiconductor region and said field effect transistor being formed in said semiconductor layer where said second semiconductor region is not formed or in another predetermined one of said second semiconductor regions.

2. A method of manufacturing a semiconductor integrated circuit device according to claim 1 in which said impurity diffusion source layer comprises a polysilicon layer doped with an impurity at a high concentration.

3. A method of manufacturing a semiconductor integrated circuit device according to claim 1 in which, at said step for forming said third semiconductor region, said diffusion of the impurity from said impurity diffusion source layer is performed until said third semiconductor region contacts the first semiconductor region contacting said last mentioned second semiconductor region.

4. A method of manufacturing a semiconductor integrated circuit device according to claim 2 in which, at said step for forming said third semiconductor region, said diffusion of the impurity from said impurity diffusion source layer is performed until said third semiconductor region contacts the first semiconductor region contacting said last mentioned second semiconductor region.

* * * * *